United States Patent
Elgort et al.

(10) Patent No.: US 7,620,440 B2
(45) Date of Patent: Nov. 17, 2009

(54) DIRECT TEMPORAL ENCODING OF SPATIAL INFORMATION

(75) Inventors: Daniel Elgort, Cleveland Heights, OH (US); Brian M. Dale, Euclid, OH (US); Jeffrey L. Duerk, Avon Lake, OH (US)

(73) Assignee: Case Western Reserve University, Cleveland, OH (US)

( * ) Notice: Subject to any disclaimer, the term of this patent is extended or adjusted under 35 U.S.C. 154(b) by 1109 days.

(21) Appl. No.: 10/439,630

(22) Filed: May 16, 2003

(65) Prior Publication Data

US 2004/0024305 A1 Feb. 5, 2004

Related U.S. Application Data

(60) Provisional application No. 60/381,140, filed on May 17, 2002.

(51) Int. Cl.
*A61B 5/05* (2006.01)
(52) U.S. Cl. ............... 600/410; 600/407; 324/307; 324/308; 324/309; 324/310
(58) Field of Classification Search .......... 600/407, 600/408, 410–423; 324/307, 310, 318
See application file for complete search history.

(56) References Cited

U.S. PATENT DOCUMENTS

| | | | | |
|---|---|---|---|---|
| 4,354,499 A | * | 10/1982 | Damadian | 600/410 |
| 4,411,270 A | * | 10/1983 | Damadian | 600/410 |
| RE32,619 E | * | 3/1988 | Damadian | 600/410 |
| RE32,689 E | * | 6/1988 | Damadian | 600/410 |
| 5,051,698 A | * | 9/1991 | Ordidge | 324/309 |
| 5,122,748 A | * | 6/1992 | Oh et al. | 324/309 |
| 5,153,515 A | * | 10/1992 | Leigh et al. | 324/307 |
| 5,347,217 A | * | 9/1994 | Leach et al. | 324/309 |
| 5,928,146 A | * | 7/1999 | Itagaki et al. | 600/410 |
| 6,087,831 A | * | 7/2000 | Bornert et al. | 324/307 |
| 6,445,183 B1 | * | 9/2002 | Shimizu et al. | 324/309 |
| 6,794,865 B2 | * | 9/2004 | Astley et al. | 324/306 |
| 6,995,560 B2 | * | 2/2006 | Duerk et al. | 324/310 |
| 7,511,490 B2 | * | 3/2009 | Abe | 324/307 |
| 2002/0036501 A1 | * | 3/2002 | Astley et al. | 324/318 |
| 2004/0155652 A1 | * | 8/2004 | Sodickson | 324/307 |
| 2007/0219442 A1 | * | 9/2007 | Aletras et al. | 600/410 |

OTHER PUBLICATIONS

Elgort, et al., Direct Temporal Encoding of Spatial Information: A Novel Non-fourier Imaging Technique, 1 pg.

(Continued)

*Primary Examiner*—Long V Le
*Assistant Examiner*—Sanjay Cattungal

(57) ABSTRACT

An improved imaging technique and apparatus for direct temporal encoding of spatial information of an object is presented. The signal collected from the object after application of excitation energy in a magnetic field is directly representative of the spatial position of the object without the need for the signal to undergo mathematical transformation. This is a result of the excitation scheme that generates transverse magnetization across the field of view that is a function of X (read-out) and Z (slice select) positions, resulting in a two-dimensional phase profile that, upon application of a constant gradient along the Z axis, elicits a signal that is directly attributable to the spatial position along the read-out dimension without application of mathematical transformation.

11 Claims, 5 Drawing Sheets

OTHER PUBLICATIONS

Schricker, et al., Dualband Spectral-Spatial RF Pulses for Prostate MR Spectroscopic Imaging, Magnetic Resonance in Medicine 46:1079-1087 (2001).

MR Image Encoding, 10 pgs.

Noll, A Primer on MRI and Functional MRI, Version 2.1, Jun. 21, 2001, 14 pgs.

Grabert, Lisa, Fourier Transform in Medical Imaging II, Jul. 1999, 10 pgs.

Rzepa, H. S., Processing the Free Induction Decay, 1 pg.

Pipe, James G., "Spatial Encoding and Reconstruction in MRI with Quadratic Phase Profiles" MRM (1995) 33:24-33.

* cited by examiner ns of data
DIRECT TEMPORAL ENCODING OF SPATIAL INFORMATION

CROSS REFERENCE TO RELATED APPLICATION

This application claims the benefit under 35 U.S.C. § 119 (e) of U.S. Provisional Application No. 60/381,140 filed May 17, 2002, titled DIRECT TEMPORAL ENCODING OF SPATIAL INFORMATION, which application is hereby incorporated by reference in its entirety.

BACKGROUND OF THE INVENTION

The present invention is related to the field of image processing, particularly medical imaging, and, more specifically, is related to a method and apparatus to achieve direct temporal encoding of spatial information.

The invention has particular application in the field of magnetic resonance imaging (MRI) and will be described in that context. In magnetic resonance imaging, the subject to be imaged is positioned in a strong magnetic field, produced, for example, in the bore of a superconducting electromagnet, and the protons of hydrogen atoms in water and fat tissue and of other magnetic resonant (MR) active nuclei align parallel and anti-parallel to the main magnetic field. These protons precess around the direction of the field at a characteristic angular frequency (the Larmor frequency) which is dependent on the strength of the magnetic field and on the properties of the specific nuclear species (the gyromagnetic constant $\gamma$ of the nucleus).

A transmit coil applies pulses of radio frequency (RF) energy at the Larmor frequency in a direction orthogonal to the main field to excite precessing nuclei to resonance, which results in the net magnetization of all MR active nuclei being flipped from the direction of the main magnetic field into a direction having a transverse component in which it can be detected by the use of a receive coil.

The received signal can be spatially encoded to produce two-dimensional (slice) or three-dimensional (slab) information about the distribution of MR active nuclei and hence of water and tissue.

Typically, a patient is slid axially into the bore of a superconducting magnet, and the main magnetic field is set up along the axis of the bore, termed by convention the Z-direction. Magnetic field gradients are set up, for example, in the Z-direction, to confine the excitation of MR active nuclei to a particular slice in the Z-direction and, in the horizontal X and the vertical Y directions, to encode the resonant MR nuclei in the plane of the slice. An RF transmit coil applies an excitation pulse to excite the protons to resonance, and RF receive coils pick up relaxation signals emitted by the disturbed protons.

To encode/decode received signals in the Y-direction, the signals are detected in the presence of a magnetic field gradient, termed a read-out gradient, to enable different positions of relaxing nuclei to correspond to different precession frequencies of those nuclei about the direction of the main magnetic field due to the influence of the gradient. The data is digitized, and so for each RF excitation pulse, a series of digital data points are collected, and these are mapped into a spatial frequency domain known as K-space. Each RF pulse permits at least one column of digital data points to be collected.

To encode/decode the received signals in the X-direction (read-out dimension), after each RF pulse has been transmitted and before data is collected with the read-out gradient applied, a magnetic field gradient in the Y-direction (phase encoded dimension) is turned on and off. This is done for a series of magnitudes of magnetic field gradients in the Y-direction, one RF pulse typically corresponding to a different magnitude of gradient in the X-direction.

On the generated K-space matrix, the columns of data points correspond to RF pulses followed by different magnitudes of phase-encode gradients.

The field of view imaged by the magnetic resonance imaging apparatus depends on the spacing (in k-space) of the data points in the phase-encode and read-out directions, and the resolution of the image depends on how far the points extend in each direction (in k-space) e.g. how large the maximum phase-encode gradient is.

The signals received from the RF receiver coils are subject to a two dimensional fast Fourier Transform in Fourier Transform processors to produce pixelated images which are stored in image memories. The processing of the signals by Fourier Transform adds a time delay between receiving the signals and viewing an image represented by the signals, thus increasing the time the patient must be subjected to the procedure.

Moreover, to enable the mathematical transformation by the Fourier Transform to accurately represent the desired image, the number of samples taken, the timing of the samples, the total time of signal acquisition, and the magnetic gradient strengths during readout must all be considered and controlled. Variance of these parameters will vary the resolution and field of view of the image.

It would be advantageous if the signals from the RF receiver coils were not subject to a mathematical transformation to produce the images, but could be encoded as images directly, thus eliminating the time delay from the mathematical processing and the need to consider and control these other parameters to enable the mathematical process to produce projection data representative of the image.

SUMMARY OF THE INVENTION

The present invention is directed toward an improved imaging method and apparatus for direct temporal encoding of spatial information requiring no mathematical transformation to convert the collected signal into image projection data.

The present invention includes a method and system for generating an image of an object. The method includes placing an object in a main magnetic field, applying excitation energy to the object to generate transverse magnetization across a field of view with phase that is a function of two dimensions, and applying a constant magnetic gradient to the object along one of the two dimensions. Then, a signal emitted by the object in response to the excitation energy is received. The magnitude of the signal at a specific point in time is directly attributable to the information content of the sample at a specific spatial position in the projection along the one of the two dimensions, and an image characteristic of the projection of the object is then displayed. The signal does not undergo mathematical transformation before being attributed to the projection at the specific spatial position.

The present invention also includes an apparatus for generating an image of the object that includes an examination region for placing the object, a magnetic field generator for generating a main magnetic field in the examination region, a gradient magnetic field generator for generating a gradient magnetic field along at least one dimension in the examination region, and an antenna for generating and receiving radio frequency pulses to and from the examination region. The main magnetic field and the radio frequency pulses generate transverse magnetization of the object across a field of view with phase that is a function of at least two dimensions, and the gradient magnetic field elicits a signal from the object directly attributable to a specific spatial position along the at least one dimension without mathematical transformation of the signal.

BRIEF DESCRIPTION OF THE DRAWINGS

In the accompanying drawings, which are incorporated in and constitute a part of this specification, embodiments of the invention are illustrated, which, together with a general description of the invention given above, and the detailed description given below, serve to exemplify the principles of this invention, wherein.

DETAILED DESCRIPTION OF THE INVENTION

The invention relates to the image processing arts and finds particular application to a method and system of magnetic resonance image (MRI) processing. Other applications in any general imaging environment, including ultrasound, high resolution imaging, or fast imaging, will be apparent to one of ordinary skill in the art, but the invention will be described in terms of a method and system of image processing in MRI systems.

In one embodiment, the signal analysis and processing components of the system and method may be implemented as software executable by one or more computers or other processing devices. It may be embodied in a computer readable medium such as a magnetic disk, digital compact disk, electronic memory, persistent and/or temporary memories, or other types of memories as known in the art.

"Software," as used herein, includes but is not limited to one or more computer readable or executable instructions that cause a computer or other electronic device to perform functions, actions, or behave in a desire manner. The instructions may be embodied in various forms such as routines, algorithms, modules, or programs including separate applications or code from dynamically linked libraries. Software may also be implemented in various forms such as a stand-alone program, a function call, a servlet, an applet, instructions stored in a memory, part of an operating system, or other type of executable instructions. It will be appreciated by one of ordinary skill in the art that the form of software is dependent on, for example, requirements of a desired application, the environment in which it operates, the desires of a designer/programmer, or the like.

"Logic," as used herein, includes but is not limited to hardware, firmware, software, or combinations of each to perform one or more functions or actions. For example, based on a desired application or need, logic may include a software controlled microprocessor, discrete logic such as an application specific integrated circuit (ASIC), or other programmed logic device. Logic may also be fully embodied as software.

In describing the processes and methods herein, the corresponding figures and flow diagrams represent one or more exemplary methodologies of the system. As illustrated, the blocks represent functions, actions, or events performed therein. It will be appreciated that electronic and software applications involve dynamic and flexible processes such that the illustrated blocks can be performed in sequences different than the one(s) shown. It will also be appreciated by one of ordinary skill in the art that elements embodied as software may be implemented using various programming approaches, such as machine language, procedural, object oriented, or artificial intelligence techniques.

As used herein, the term "or" has the inclusive, and not the exclusive, meaning. In other words, "A or B" indicates A or B or both.

Figure 1:
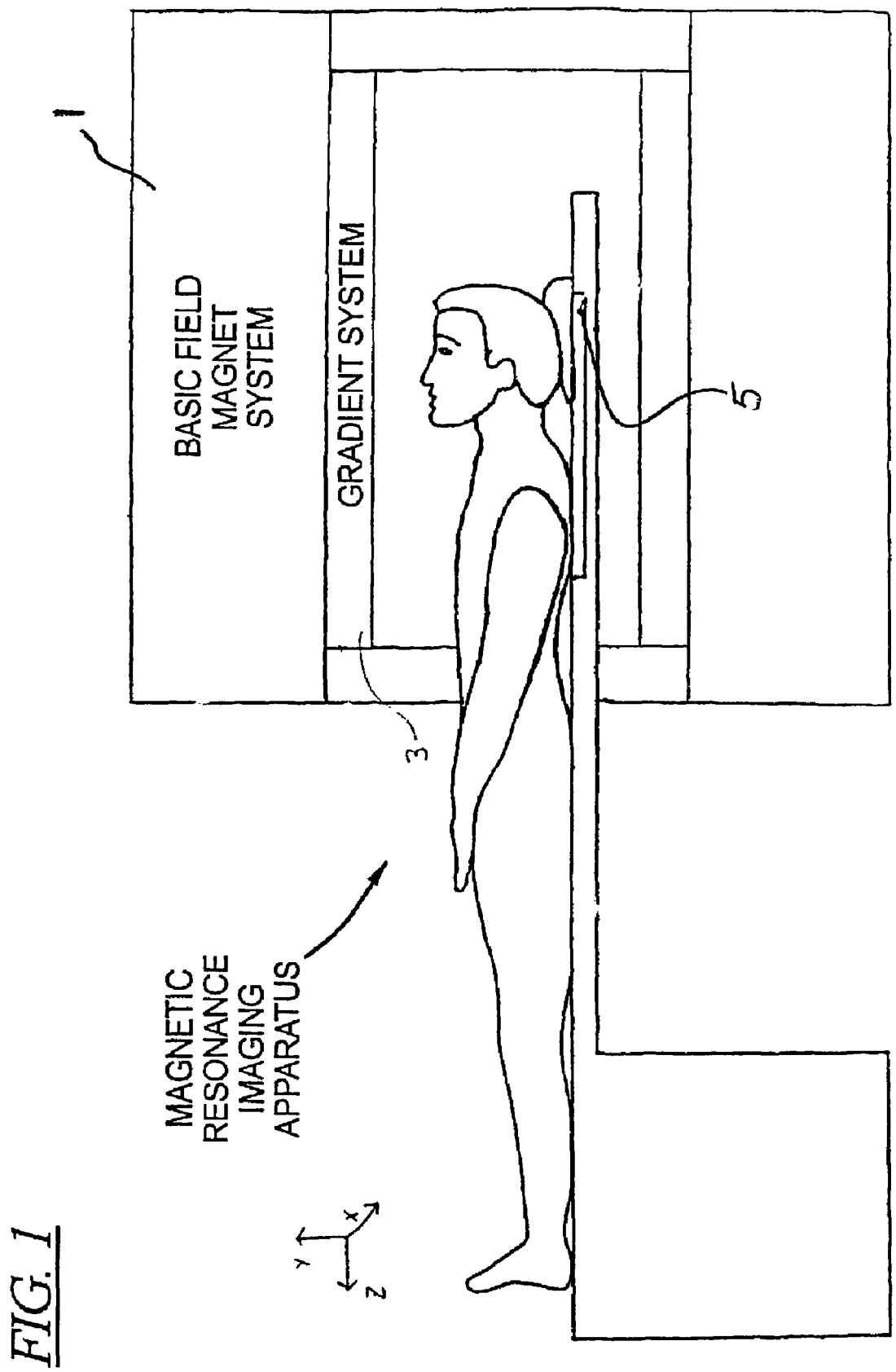
FIG. 1 is a representative side view of an imaging apparatus.
Figure 2:
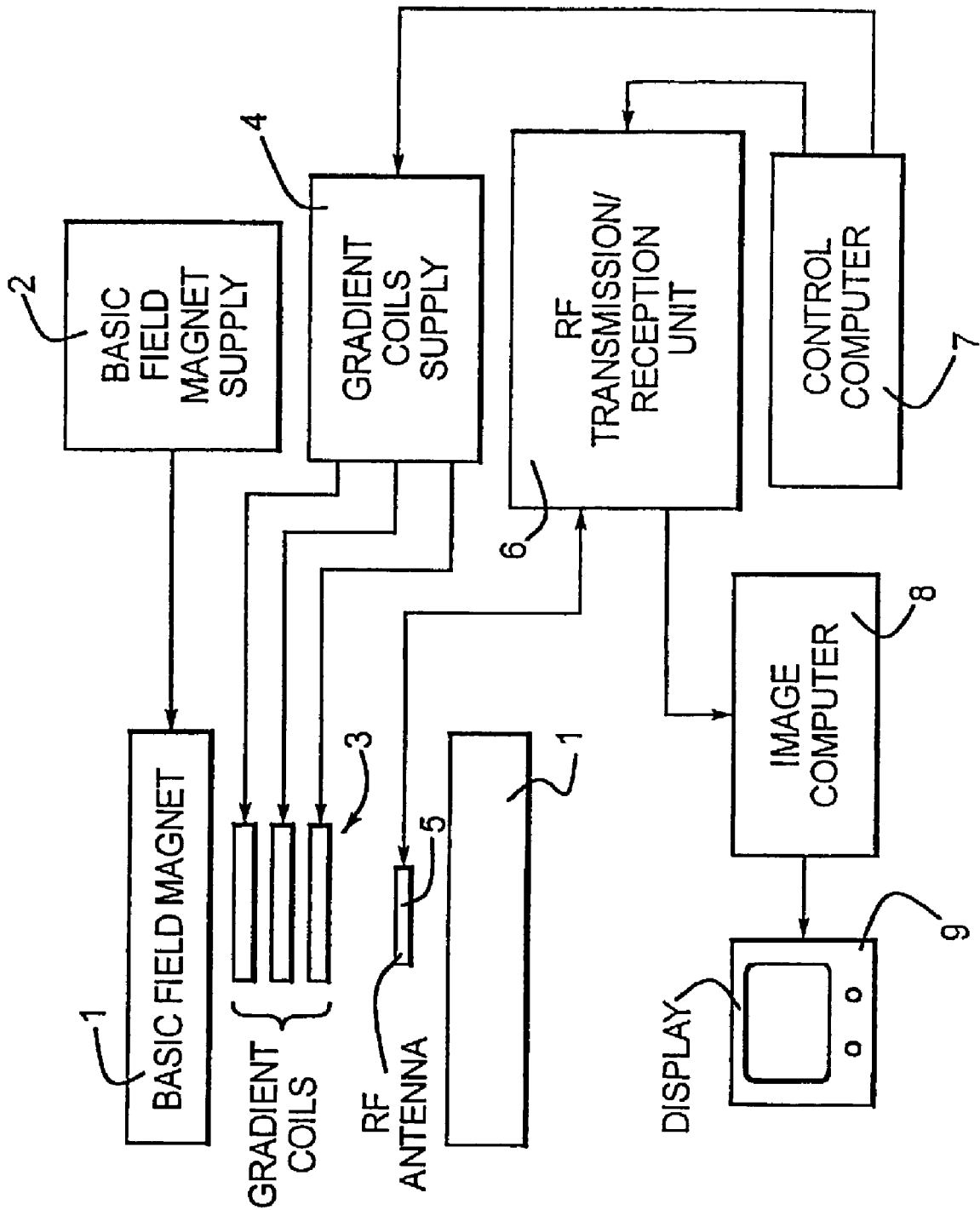
FIG. 2 is a schematic representation of an imaging system.

FIGS. 1 and 2 illustrate one embodiment of a magnetic resonance imaging system and apparatus according to the present invention. The apparatus includes a basic field magnet 1 and a basic field magnet supply 2. The system has gradient coils 3 for emitting the gradient magnetic fields, $G_x$, $G_y$, and $G_z$, operated by a gradient coil supply 4. An RF antenna 5 is provided for generating the RF pulses, and for receiving the resulting magnetic resonance signals from an object being imaged. The RF antenna 5 is operated by an RF transmission/reception unit 6. The gradient coil supply 4 and the RF transmission/reception unit 6 are operated by a control computer 7 to produce radio frequency pulses that are directed to the object to be imaged. The magnetic resonance signals received by the RF antenna 5 are not subjected to a transformation process, such as a two dimensional fast Fourier Transform, but represent the spatial information of the object itself without the need for mathematical transformation. An image computer 8 or other similar processing device may directly encode the signals into projection data, which may then be shown on a display 9.

The imaging technique of the present invention is designed to achieve direct temporal encoding of spatial information by implementing an improved excitation scheme. The excitation imparts a specific two-dimensional (2D) phase profile across the field of view. The subsequent application of a standard read-out gradient will yield a signal where the magnitude at a given point in time can be directly attributed to the projection at a specific spatial position along the read-out dimension; no mathematical transformation, such as through Fourier Transform, are required. The raw signal data is directly image data or projection data without the need for mathematical transformation. Furthermore, resolution generally is not affected by read-out gradient strength or sampling timings, as is the case with conventional Fourier imaging. Overall resolution obtained by the method and system of the present invention may be improved compared to techniques in which the one-dimensional data undergoes mathematical transforms before projection image data is generated and displayed.

Image resolution along the read direction is not defined by gradient strength or analog-to-digital converter (ADC) timing during sampling, as with conventional imaging in which the received signal undergoes Fourier transform mathematical transformation into projection data that may be viewed. An improved excitation scheme is used that generates transverse magnetization across the field of view with phase that is a function of both X (read-out) and Z (slice select) position (with uniform magnitude). The excitation geometry of the present invention is not limited to rectilinear planes, but also includes arbitrary and specific non-rectilinear geometries, such as spheres, cones, rods, and the like.

The RF excitation energy provided to the patient or other object under analysis is provided by gradient coils 3 such that a 2D phase profile is attained, such as by generation of a second order magnetic field that has dependence on X and Z. The magnetic field strength is proportional to the product of these two dimensions X and Z. The coil structure 3, 4 must be capable of variable amplitude and capable of being switched on or off in less than one millisecond, and, preferably, in less than 200 microseconds. There are several specific methods and apparatuses available to generate a 2D phase profile that will be apparent to one of ordinary skill in the art, and any of these may be utilized, depending on the needs, desires, availability, and other circumstances of a particular application, without departing from the spirit or scope of the invention.

Figure 3:
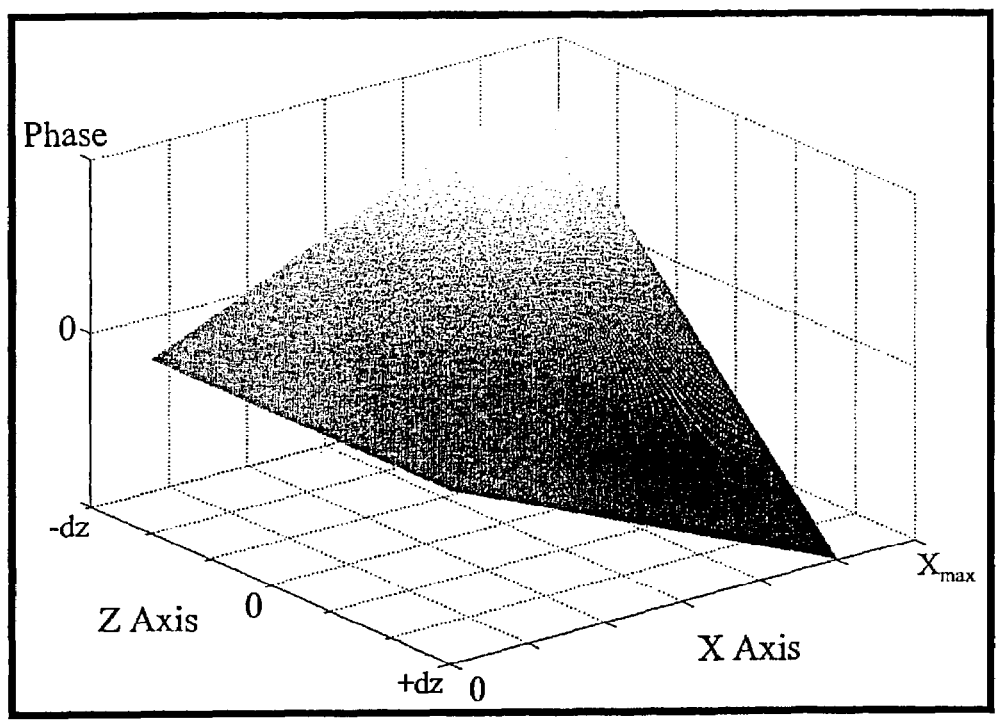
FIG. 3 is a representative graphical depiction of a phase profile according to the present invention.

The 2D phase profile is imparted such that the subsequent application of a constant gradient, aligned along the Z axis, elicits a signal where the amplitude at a given point in time can be directly attributed to a specific spatial position along the read-out dimension. A representative excitation phase profile is illustrated in FIG. 3. There is no need for spatial encoding after the initial RF excitation because the spatial characteristics are available from the 2D phase profile generated with the second order magnetic field. Although this embodiment is discussed in terms of X and Z, any two dimensions may be used for the phase profile without departing from the spirit and the scope of the invention, and the invention is not limited to a 2D phase profile using only X and Z components.

The 2D phase profile may be generated with a second order gradient coil that generates a magnetic field with behavior in two dimensions (e.g. a field that is proportional to X*Z). These second order gradient coils are often present in standard MRI machines. These second order gradient coils conventionally are not used for imaging and are instead used only for shimming (tuning) the main magnetic field.

The excitation scheme implemented results in transverse magnetization that can be characterized by the following formula:

$$\exp[i*2\pi\gamma*C*Z*X] \quad [1]$$

where $\gamma$ is the gyromagnetic ratio that is a constant, unique to every atom, Z and X are positions along the "slice-select" and "read-out" dimensions respectively, and C is a scaling constant.

Once this phase profile is achieved, applying a gradient field along the Z axis will generate additional time-dependent phase in the transverse magnetization. During the application of this gradient, the signal is defined by equation [2]:

$$s(t) = \int_x \int_z \rho(x) e^{i(2\pi\gamma*CZX - 2\pi\gamma*GZ*t)} dz\, dx \quad [2]$$

where s(t) is the signal generated as a function of time, $\rho(x)$ is the spatial profile of the sample along the read-out direction, the first term in the exponential is the phase imparted during excitation and the second term is the phase due to the application of the gradient. In the limit as the Z-axis extends to +/− infinity, the relationship between the signal magnitude at any point in time and the signal content at a given point along the read-out dimension is clear:

$$s(t) = \int_x \rho(x) \delta(CX - Gt) dx \quad [3]$$

The delta function, $\delta(C*X - G*t)$, will equal one whenever $C*X$ equals $G*t$. Under non-ideal conditions, when the Z-axis is constrained to $\pm \Delta z/2$, the signal as a function of time is:

$$s(t) = \int_x \rho(x) \mathrm{sinc}\left((2\pi\gamma)*(CX - Gt)*\left(\frac{\Delta z}{2}\right)\right) dx \quad [4]$$

The sinc function in equation [4] can be interpreted as a point spread function (PSF) indicating the resolution achievable along the read-out dimension.

Figure 4:
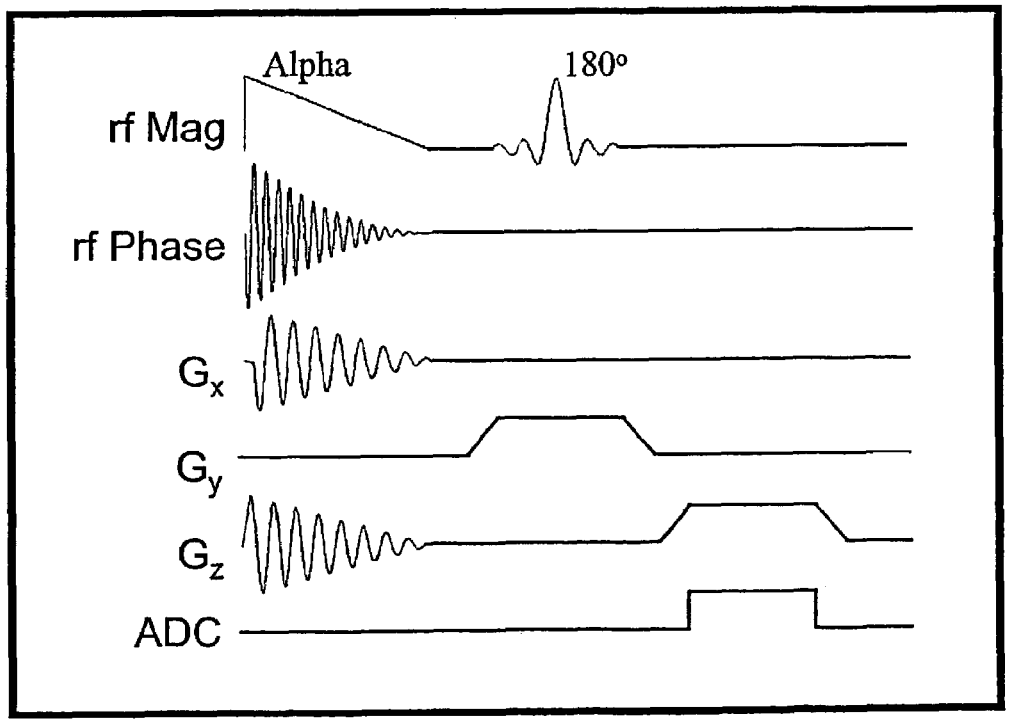
FIG. 4 is a graphical representation of a sample pulse sequence according to the present invention.
Figure 6:
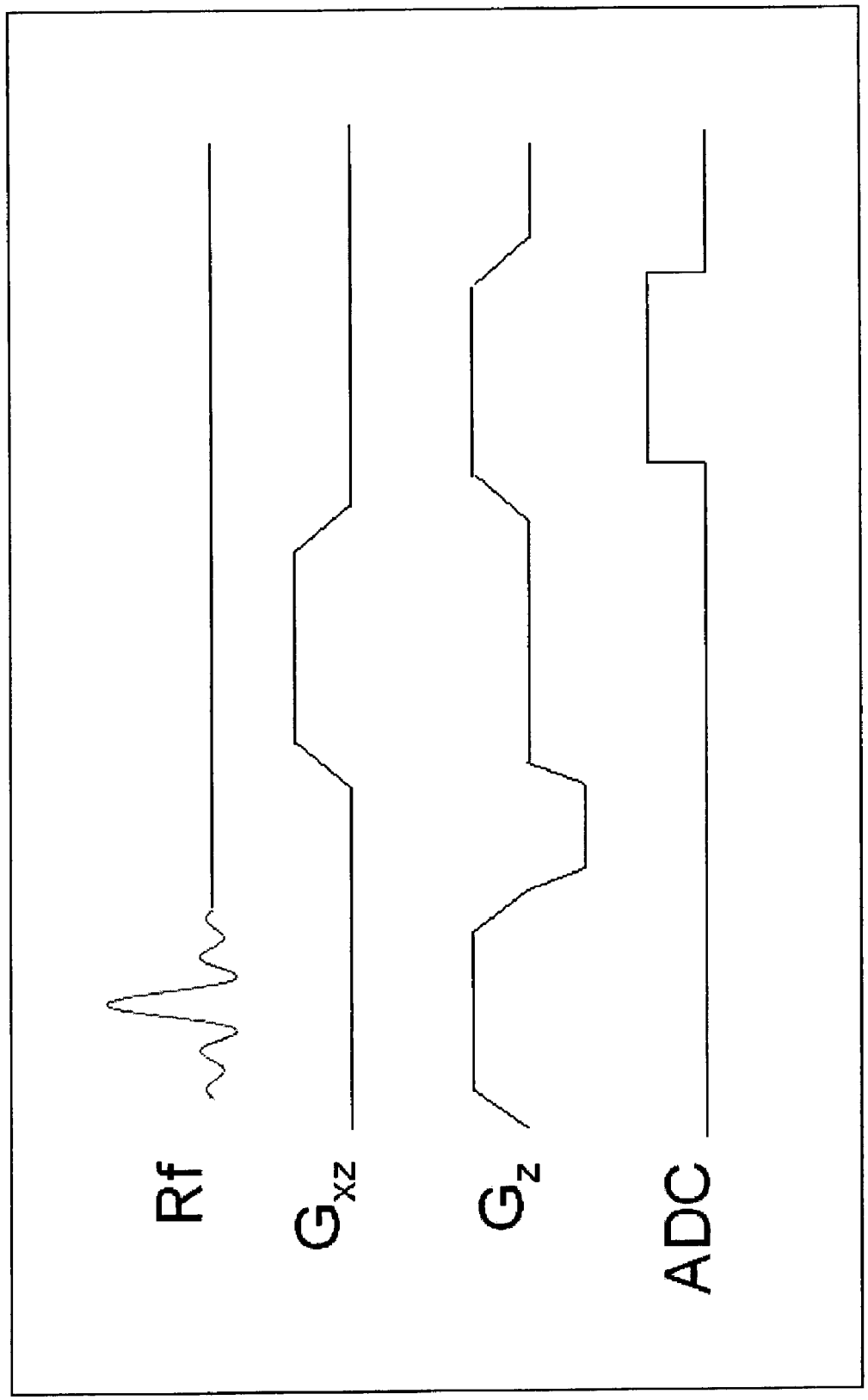
FIG. 6 is a graphical representation of a sample pulse sequence using a second order gradient coil according to the present invention.

The pulse sequence is slice selective along the Z dimension, and imparts the phase profile described in formula [1]. A spatially selective 180° RF pulse is applied to restrict the measured signal in the Y dimension; the center frequency of the 180° pulse is varied each repetition time (TR), so that signal is collected from the entire slice, as represented in the sample pulse sequence shown in FIG. 4. An exemplary pulse generated by a second order gradient coil is shown in FIG. 6.

Figure 5:
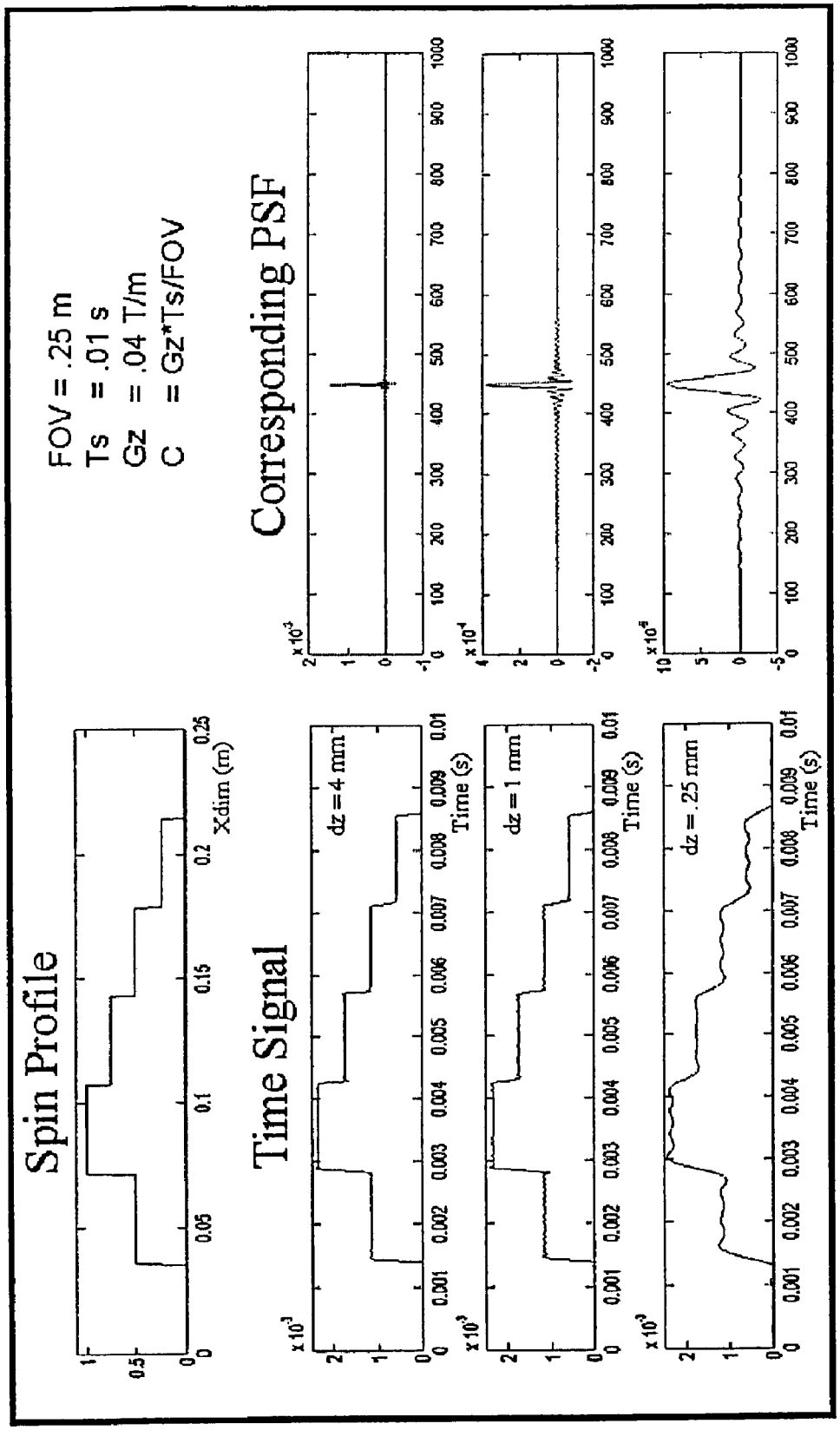
FIG. 5 is a graphical representation of simulated magnetic resonance signals and point spread functions.

Computer simulations demonstrate that using realistic values for the length of the Z-axis and read-out gradient strengths result in sub-millimeter PSF's and resolution, as shown in FIG. 5.

This improved method for imaging encodes spatial information directly in the time domain signal. Resolution along the read direction is not dependent on the imaging parameters used during signal sampling. Instead, resolution is dependent on parameters during excitation; longer and steeper phase profiles along the Z-axis result in a narrower PSF.

This method can be extended to collect spectroscopic information about a material. With minor modifications to the excitation, the "read-out" dimension could be changed from a spatial dimension to a chemical shift axis. In nuclear magnetic resonance spectroscopy, chemical shift refers to the change in resonant frequency of the hydrogen protons due to the differences in local molecular environment (e.g. hydrogen protons in fat have a resonant frequency shifted about 3 parts per million from the protons in water). In general, spectroscopy is not limited to hydrogen protons. Any nucleus with a net magnetic moment can be used; some common examples are Sodium-23, Phosphorus-31, and Flourine-19.

Specifically, this excitation scheme would could be extended to spectroscopy by imparting a continuous phase profile along a chemical shift dimension, where each frequency is dephased a slightly different amount. The subsequent application of a gradient field would then yield a signal in time that would directly reflect the signal content at different chemical shift values. This method may be used for temporally sensitive and high resolution clinical applications, as well as spectral analysis that requires resolution tailored to specific species of interest or higher spatial resolution in less time.

While the present invention has been illustrated by the description of embodiments thereof, and while the embodiments have been described in some detail, it is not the intention of the applicant to restrict or in any way limit the scope of the appended claims to such detail. Additional advantages and modifications will readily appear to those skilled in the art, for example, by use of a gradient coil that generates a magnetic field having Z times X dependence. Another variation would be taking a set of projections at different angles to reconstruct the image, or to provide excitation line by line and read out the profile of each line, then raster scanning to construct the image. Therefore, the invention in its broader aspects is not limited to the specific details, representative apparatus and methods, and illustrative examples shown and described. Accordingly, departures may be made from such details without departing from the spirit or scope of the applicant's general inventive concept.

We claim:

1. A method for generating an image of an object, comprising:

placing the object in a main magnetic field;

controlling a magnetic resonance imaging apparatus to produce a two dimensional phase profile by generating a second order magnetic field by applying energy to an object positioned in a main magnetic field associated with the MRI apparatus to generate transverse magnetization with phase that is a function of two dimensions, where the magnetic field strength is proportional to the product of the two dimensions;

eliciting from the object a signal whose amplitude at a point in time is directly attributable to a spatial position on a read-out gradient by applying a constant magnetic gradient to the object along at least one of the two dimensions; and receiving a signal emitted by the object as a result of eliciting the signal displaying an image characteristic of the spatial position as a function of the signal amplitude without performing a Fourier Transform on the elicited signal.

2. The method of claim 1, where the energy applied to the object is radio frequency energy and where the signal is a radio frequency signal.

3. The method of claim 1, where applying a constant magnetic gradient to the object comprises generating the gradient with a second order gradient coil.

4. An apparatus comprising:

a magnetic field generator for generating a main magnetic field associated with an MRI apparatus;

a gradient magnetic field generator for generating a gradient magnetic field along at least one dimension of the object; and an antenna for generating and receiving radio frequency pulses;

where the main magnetic field and the radio frequency pulses generate transverse magnetization of the object with phase that is a function of at least two dimensions, where the main magnetic field and the radio frequency pulses produce a two dimensional phase profile by generating a second order magnetic field, where the magnetic field strength is proportional to the product of the two dimensions, and where the gradient magnetic field elicits a signal from the object directly attributable to a specific spatial position without a Fourier Transform of the signal.

5. The apparatus of claim 4, where the gradient magnetic field generator is configured to generate a gradient magnetic field of variable amplitude.

6. The apparatus of claim 4, where the gradient magnetic field generator is configured to switch the gradient magnetic field on or off in less than one millisecond.

7. The apparatus of claim 6, where the gradient magnetic field generator is configured to switch the gradient magnetic field on or off in less than 200 microseconds.

8. The apparatus of claim 4, where the gradient magnetic field generator comprising second order gradient coils.

9. The method of claim 1, where the transverse magnetization is characterized by:

$$\exp[i*2\pi\gamma*C*Z*X] \qquad [1]$$

where $\gamma$ represents a constant gyromagnetic ratio unique to an atom:

where Z represents a position along a slice-select dimension:

where X represents a position along a read-out dimension; and where C is a scaling constant.

10. The method of claim 9, where during the application of the gradient the signal is defined by:

$$s(t) = \int_x \int_z \rho(x) e^{i(2\pi\gamma*CZX - 2\pi\gamma*GZ*t)} dz dx \qquad [2]$$

where s(t) is the signal generated as a function of time;

where $\rho(x)$ is the spatial profile of the sample along the read-out direction;

where $2\pi\gamma*CZX$ is the phase imparted during the excitation; and where $2\pi\gamma*GZ*t$ is the phase due to the application of the gradient.

11. The method of claim 10, where the relationship between the signal magnitude at a point in time and the signal content at a point along the readout dimension is described by:

$$s(t) = \int_x \rho(x) \delta(CX - Gt) dx. \qquad [3]$$

* * * * *

UNITED STATES PATENT AND TRADEMARK OFFICE
CERTIFICATE OF CORRECTION

| | |
|---|---|
| PATENT NO. | : 7,620,440 B2 |
| APPLICATION NO. | : 10/439630 |
| DATED | : November 17, 2009 |
| INVENTOR(S) | : Elgort et al. |

It is certified that error appears in the above-identified patent and that said Letters Patent is hereby corrected as shown below:

Detailed Description:

In column 6, line 52, delete "would".

Claims:

In column 8, line 16, delete "where".

Signed and Sealed this

Twelfth Day of January, 2010

David J. Kappos
*Director of the United States Patent and Trademark Office*

UNITED STATES PATENT AND TRADEMARK OFFICE
CERTIFICATE OF CORRECTION

PATENT NO. : 7,620,440 B2  Page 1 of 1
APPLICATION NO. : 10/439630
DATED : November 17, 2009
INVENTOR(S) : Elgort et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 1585 days.

Signed and Sealed this

Twenty-sixth Day of October, 2010

David J. Kappos
*Director of the United States Patent and Trademark Office*